(12) United States Patent
Yi

(10) Patent No.: US 7,323,387 B2
(45) Date of Patent: Jan. 29, 2008

(54) METHOD TO MAKE NANO STRUCTURE BELOW 25 NANOMETER WITH HIGH UNIFORMITY ON LARGE SCALE

(75) Inventor: Ge Yi, Culmore (IE)

(73) Assignee: Seagate Technology LLC, Scotts Valley, CA (US)

( * ) Notice: Subject to any disclaimer, the term of this patent is extended or adjusted under 35 U.S.C. 154(b) by 446 days.

(21) Appl. No.: 10/987,743

(22) Filed: Nov. 12, 2004

(65) Prior Publication Data
US 2006/0105562 A1  May 18, 2006

(51) Int. Cl.
*H01L 21/336* (2006.01)

(52) U.S. Cl. .................... 438/270; 977/789

(58) Field of Classification Search .......... 438/595, 438/596, 270; 977/700, 712, 742, 780, 789
See application file for complete search history.

(56) References Cited

U.S. PATENT DOCUMENTS

| | | | | |
|---|---|---|---|---|
| 4,781,689 A | * | 11/1988 | Sealfon et al. | 604/134 |
| 5,189,501 A | * | 2/1993 | Kawamura et al. | 257/647 |
| 5,336,634 A | * | 8/1994 | Katayama et al. | 438/406 |
| 5,877,065 A | * | 3/1999 | Yallup | 438/404 |
| 6,255,194 B1 | * | 7/2001 | Hong | 438/435 |
| 6,504,210 B1 | * | 1/2003 | Divakaruni et al. | 257/344 |
| 6,528,412 B1 | * | 3/2003 | Wang et al. | 438/628 |
| 6,579,809 B1 | | 6/2003 | Yang et al. | |
| 6,593,065 B2 | * | 7/2003 | Scherer | 430/314 |
| 6,653,181 B2 | | 11/2003 | Hergenrother et al. | |
| 6,664,156 B1 | | 12/2003 | Ang et al. | |
| 6,686,271 B2 | | 2/2004 | Raaijmakers et al. | |
| 6,699,783 B2 | | 3/2004 | Raaijmakers et al. | |
| 6,753,618 B2 | * | 6/2004 | Basceri et al. | 257/296 |
| 6,767,788 B2 | * | 7/2004 | Kim | 438/253 |
| 6,914,316 B2 | * | 7/2005 | Yun et al. | 257/506 |
| 2003/0015764 A1 | | 1/2003 | Raaijmakers et al. | |
| 2003/0049375 A1 | | 3/2003 | Nguyen et al. | |
| 2005/0208752 A1 | * | 9/2005 | Colburn et al. | 438/619 |

OTHER PUBLICATIONS

Ge Yi and Walther Schwarzacher, Single crystal superconductor nanowires by electrodeposition, Mar. 22, 1999, pp. 1746-1748, vol. 74, No. 12.

P.R. Evans, G. Yi, and W. Schwarzacher, Current perpendicular to plane giant magnetoresistance of multilayered nanowires electrodeposited in anodic aluminum oxide membranes, Jan. 24, 2000, pp. 481-483, vol. 76, No. 4.

\* cited by examiner

*Primary Examiner*—W. David Coleman
(74) *Attorney, Agent, or Firm*—Kinney & Lange, P.A.

(57) ABSTRACT

A method of making a nano structure smaller than 25 nanometers utilizing atomic layer deposition, planarizing, and etching techniques.

35 Claims, 5 Drawing Sheets

METHOD TO MAKE NANO STRUCTURE BELOW 25 NANOMETER WITH HIGH UNIFORMITY ON LARGE SCALE

BACKGROUND OF THE INVENTION

The present invention relates generally to the fabrication of a device containing nano structures, and more particularly to a method of uniformly fabricating nano trenches or nano wires in a range of 25 nanometers and below.

As the physical make-up of electrical and magnetic devices shrinks to the nano level, the requirement for nano structures and methods of making nano structures increases. Current alternative pattern transfer processes and lithography techniques are incapable of consistently and efficiently fabricating a feature on a device smaller than 30 nanometers. The smallest structure which can be patterned using photolithography is around 50 nanometers, while for electron beam lithography tools the structures could be as small as 30 nanometers. Using current processes, however, results in difficult integration and electron back-scattering which can interact negatively with magnetic fields and conduction requirements of the overall structure. Furthermore, current techniques do not allow for patterning and producing a nano structure from ferromagnetic materials smaller than 30 nanometers, much less doing it efficiently, inexpensively, and in a highly uniform large scale production.

Studies of high aspect ratio structures with widths in the nanometer range have revealed magnetic, superconducting, and magnetotransport properties. Currently, however, it is difficult to fabricate nano structures in a controlled and reliable fashion. Accordingly, there is a need for a method to ensure efficiently and uniformly fabricated nano structures smaller than 25 nanometers.

BRIEF SUMMARY OF THE INVENTION

The present invention relates to a method of making a device with nano structures smaller than 25 nanometers. The method entails depositing a nano film onto horizontal and vertical surfaces of a substrate using an atomic layer deposition process; forming a dielectric layer on top of the nano film; and planarizing the dielectric layer and the nano film to form the nano structure in a position located between the substrate and the dielectric layer.

DETAILED DESCRIPTION

The inventive method is described in terms of the formation of a general device having two sets of nano structures. In the following illustrations, the two sets of nano structures include nano wires and nano trenches. The nano structures can be filled, with a conducting material like nickel or copper for example, and are then referred to as nano wires. If the nano structures are not filled with any material, and are therefore left "empty," then they are referred to as nano trenches.

The inventive method has various potential applications. Currently, a method to reliably and uniformly create a nano structure, either a nano trench or a nano wire, smaller than 25 nanometers does not exist in the art. A structure of this size has a wide variety of applications in electrical and magnetic devices. In magnetic transducers, for example, nano trenches can be used in defining a magnetic writer top shield width. Nano wires, on the other hand, can be used to define reader width for a magnetic reader acting as a mill mask or to increase the random access memory (RAM) capacity dramatically in electronic devices.

The method generally includes the following seven steps:

Step 1—depositing an initial layer over a substrate (this step is not needed for forming nano trenches, but is needed to form nanowires by electroplating);

Step 2—depositing a dielectric layer over the initial layer;

Step 3—removing a middle segment from the dielectric layer;

Step 4—depositing a nano film onto the dielectric layer and the initial layer;

Step 5—depositing a dielectric layer onto the nano film;

Step 6—removing the excess dielectric layer and nano film to form parallel nano structures;

Step 7—etching the nano film from the nano structures to form parallel nano trenches.

At this point, parallel nano trenches smaller than 25 nanometers are formed within a device. The next seven steps (Step 8-Step 14) are not essential for the method but show how nano wires are formed and how multiple layers of nano structures can be formed within a single device.

Step 8—filling the nano trenches with an electroplating material to form nano wires;

Step 9—depositing a dielectric layer on top of the nano wires;

Step 10—removing a middle segment, perpendicular to the nano wires, from the dielectric layer;

Step 11—depositing a nano film onto the dielectric layer and where the middle segment has been removed;

Step 12—depositing a dielectric layer onto the nano film;

Step 13—removing the excess dielectric layer and nano film to form parallel nano structures; and Step 14—etching the nano film from the nano structures to form parallel nano trenches.

At this point, as mentioned above, Step 8-Step 14 can be repeated multiple times to form multiple layers of nano wires.

The following description and figures illustrate how to form a general device having one set of nano wires and one set of nano trenches. FIG. 1-FIG. 7 illustrate the steps (Step 1-Step 7) that are required to fabricate a general device having parallel nano trenches. FIG. 8 illustrates how to fill the nano trenches with an electroplating material, such as nickel or copper, to form nano wires. FIG. 9-FIG. 14 illustrate how to form parallel nano trenches on top of the nano wires.

In the written description accompanying FIG. 1-FIG. 14, a generalized device for utilizing the inventive method is discussed. One embodiment, defining a magnetic reader width or defining a magnetic writer top pole width within magnetic transducers, is also discussed. Applying this magnetic transducer application allows for an example to be given for one embodiment's lengths, widths, and the materials needed to uniformly make nano structures for use in magnetic transducers. The inventive method, however, has various potential applications due to the fact that a structure smaller than 25 nanometers has remained impossible to fabricate, in a mass production setting, for use in electrical and magnetic devices.

Figure 1:
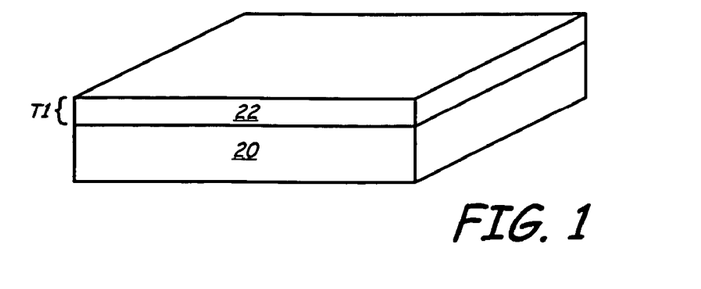
FIG. 1 is a perspective view of a substrate with an initial layer.

FIG. 1 is a perspective view of a substrate 20 with an initial layer 22 deposited on top. In other embodiments, substrate 20 includes initial layer 22. FIG. 1 illustrates Step 1 in the method. For simplification, substrate 20 is illustrated as a single uniform structure in FIG. 1. In further embodiments, additional layers, patterns, or structures may be included but are not relevant for the method.

Initial layer 22 is deposited onto substrate 20 using conventional techniques. In one embodiment, substrate 20 is made from silicon. In other embodiments, substrate 20 may be made from various other materials. For a magnetic writer, for example, substrate 20 is made of AlTiC or other materials and initial layer 22 is a seed layer which is made from a non-magnetic/metallic layer, such as copper which has excellent conducting properties. For a magnetic reader, for example, substrate 20 is made from AlTiC or other materials and initial layer 22 is a seed layer which can be either a non-magnetic/metallic layer or a magnetic/metallic layer, such as nickel or cobalt. Initial layer 22 has a thickness T1 in a range of about 250 Angstroms to about 600 Angstroms if it is for a magnetic writer, and a thickness T1 in a range of about 30 Angstroms to about 600 Angstroms if it is for a magnetic reader material.

Figure 2:
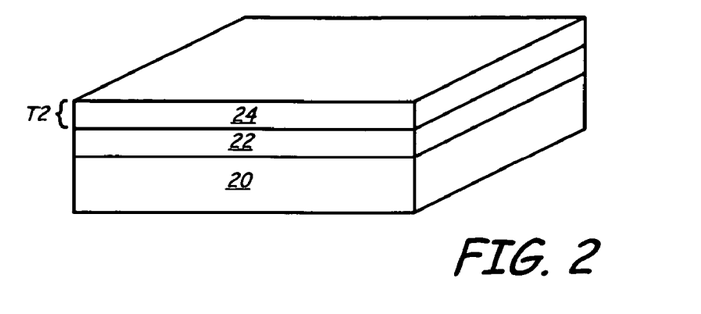
FIG. 2 is a perspective view of the structure shown in FIG. 1 with a dielectric layer formed.

FIG. 2 is a perspective view of the structure shown in FIG. 1 with a dielectric layer 24 formed. FIG. 2 is an illustration of Step 2 in the method. Dielectric layer 24 is deposited on top of initial layer 22 using conventional deposition processes.

In a magnetic reader or writer, for example, dielectric layer 24 has a thickness T2 in a range of about 20 nanometers to about 80 nanometers. Dielectric layer 24 can be composed of a number of various dielectric materials. In one embodiment, dielectric layer 24 is composed of silicon dioxide ($SiO_2$). In other embodiments, other dielectric materials may be used.

Due to the different fabrication requirements for a magnetic reader and writer, if initial layer 22 is made for a magnetic reader, then dielectric layer 24 will need to be formed at a temperature range of about 100 degrees Celsius to about 249 degrees Celsius. An example of a dielectric material that can be formed in this temperature range is silicon dioxide. On the other hand, if initial layer 22 is made for a magnetic writer, then the deposition process can be carried out at low temperature (lower than 100 degrees Celsius).

Figure 3:
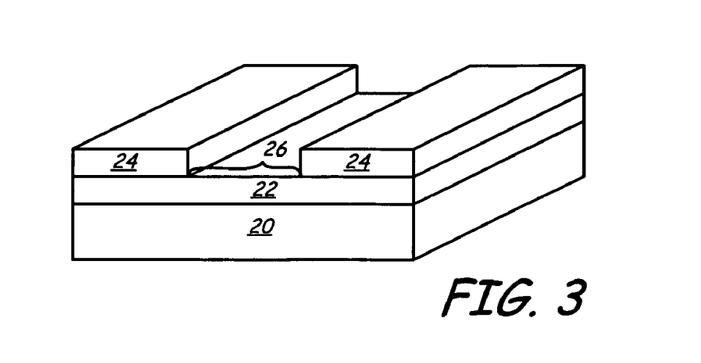
FIG. 3 is a perspective view of the structure shown in FIG. 2 with a middle segment removed.

FIG. 3 is a perspective view of the structure shown in FIG. 2 with a middle segment 26 removed. FIG. 3 illustrates Step 3 in the method. In one embodiment utilizing a magnetic reader or writer application, about a forty percent area of dielectric layer 24 is removed from the middle of dielectric layer 24.

Middle segment 26 is removed through use of a photoresist (not shown). The photoresist is composed of an organic light sensitive material which is exposed to an ultraviolet image of a desired pattern, and then developed in a wet solvent bath so that the exposed region has the photoresist removed from it. Using ion milling, chemical assistant ion milling, or reactive ion etching, dielectric layer 24 is patterned. This technique removes the pattern from the areas not protected by the resist. In other embodiments various patterns may be used, resulting in different percentages of the area of dielectric layer 24 being removed.

Figure 4:
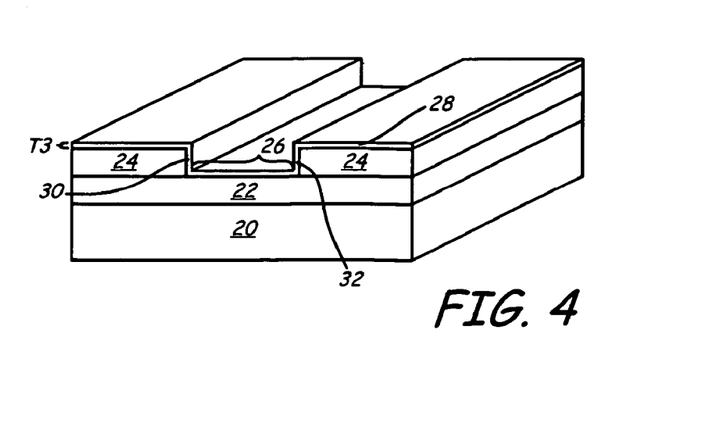
FIG. 4 is a perspective view of the structure shown in FIG. 3 with a nano film deposited.

FIG. 4 is a perspective view of the structure shown in FIG. 3 with a nano film 28 deposited. FIG. 4 illustrates Step 4 in the method. Nano film 28 is deposited on top of dielectric layer 24, and on open area 26 of initial layer 22 through atomic layer deposition techniques. Lane 30 and lane 32 are filled with nano film 28 and form at a ninety degree angle where dielectric layer 24 meets open area 26 of initial layer 22. In one embodiment, nano film 28 is aluminum oxide ($Al_2O_3$). In other embodiments, nano film 28 can be any material that can be deposited in a thickness of 25 nanometers or smaller, and is different from dielectric layer 24.

Nano film 28 is deposited in a thickness T3 of about 5 nanometers to about 25 nanometers. Thickness T3 of the deposited nano film 28 is directly proportional to the uniform width of the nano structure that is created by the method. Therefore, thickness T3 of the nano film 28 that is deposited is critical to the eventual width of the nano structure (either a nano wire or nano trench). In one embodiment, the use of aluminum oxide allows for extremely precise deposition because aluminum oxide can be deposited in a controlled manner on the nano scale. Reliably controlling aluminum oxide deposition down to the nano scale allows for consistent uniformity of the nano structures on substrate 20 and also from substrate-to-substrate.

Figure 5:
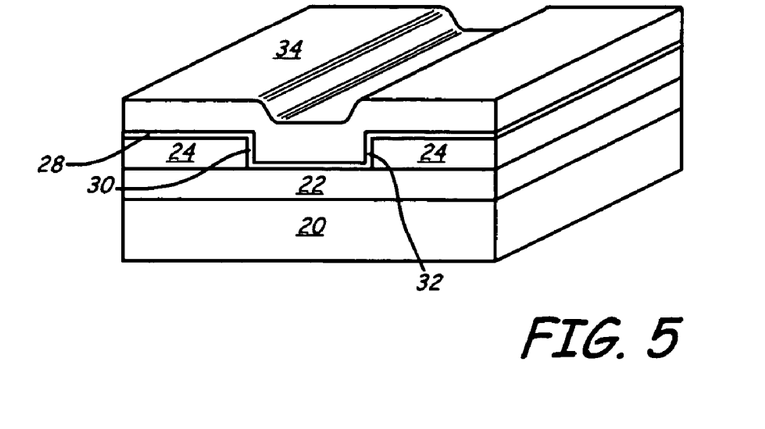
FIG. 5 is a perspective view of the structure shown in FIG. 4 with a dielectric layer formed.

FIG. 5 is perspective view of the structure shown in FIG. 4 with a 25 dielectric layer 34 formed. FIG. 5 also illustrates Step 5 in the method. Dielectric layer 34 is deposited, using standard deposition techniques such as ion beam deposition, onto nano film 28. Dielectric layer 34 is the same material as dielectric layer 24; in one embodiment it is silicon oxide. Dielectric layer 34 directly abuts lane 30 and lane 32 so no voids or gaps exist between dielectric layer 34 and lanes 30 and 32, which are filled with nano film 28.

Figure 6:
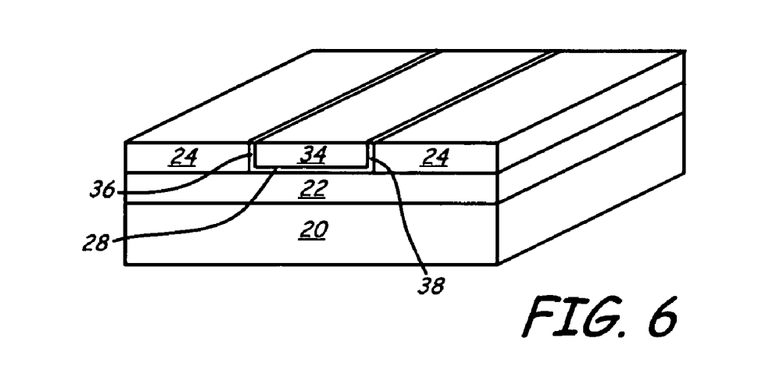
FIG. 6 is a perspective view of the structure shown in FIG. 5 with the excess dielectric layer removed and parallel nano structures formed.

FIG. 6 is a perspective view of the structure shown in FIG. 5 with the excess dielectric layer 34 removed and nano structures 36 and 38 formed. FIG. illustrates Step 6 of the method. Following the deposition of dielectric layer 34 over nano film 28, a Chemical Mechanical Polishing (CMP) procedure is used to remove excess dielectric layer 34 and nano film 28, and to planarize the entire surface. After the CMP step is performed, a planar surface is created where dielectric layer 24, lane 30, lane 32, and dielectric layer 34 are all at the same height. The CMP step, a standard procedure used in the art, uses an aqueous based abrasive slurry to flatten out the textures formed by the different layers. Nano structures 36 and 38 are formed where lane 30 and lane 32 used to be located.

Figure 7:
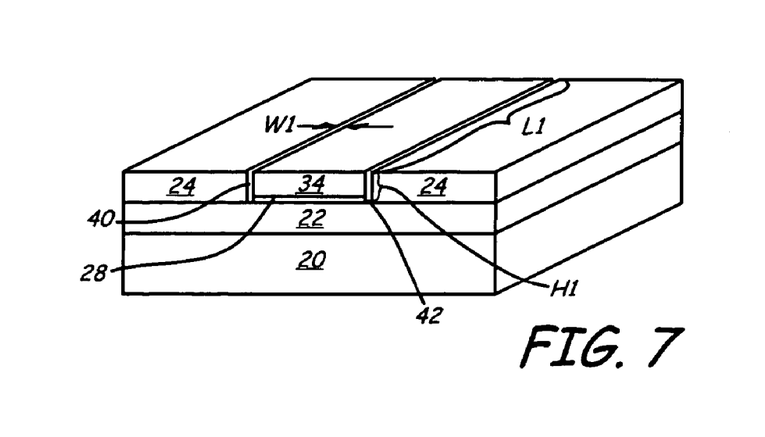
FIG. 7 is a perspective view of the structure shown in FIG. 6 with the nano film removed from the parallel nano structures, forming parallel nano trenches.
Figure 8:
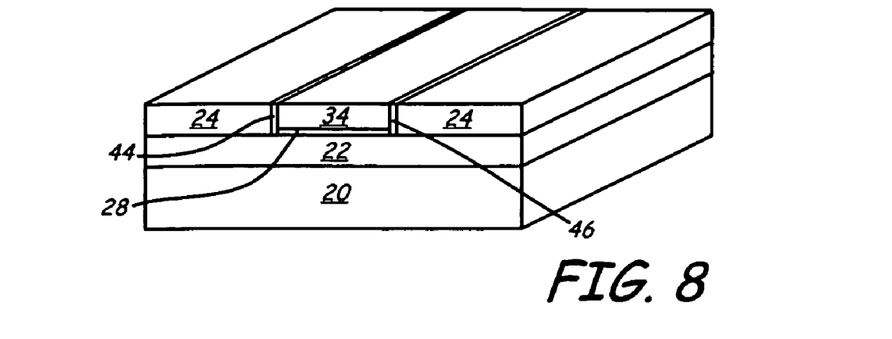
FIG. 8 is a perspective view of the structure shown in FIG. 7 with the nano trenches filled with an electroplating material to form parallel nano wires.

FIG. 7 is a perspective view of the structure shown in FIG. 6 with nano film 28 removed from nano structures 36 and 38, thereby forming nano trenches 40 and 42. FIG. 7 illustrates Step 7 of the method.

To create nano trenches 40 and 42, nano film 28 "filling" nano structures 36 and 38 is removed. This can be done through either a selective wet etching or a selective dry etching process, or a combination of both wet and dry etching. Standard process wet or dry etching is known by persons skilled in the art. In one embodiment, nano film 28 is aluminum oxide and is selectively removed through a dry etching process which uses a chlorine based gas, for example $BCl_3$, to selectively remove only the aluminum oxide.

In other embodiments, various other elements, for example fluorine, may be used or wet etching procedures utilizing sodium hydroxide or some other solution may also be used. The horizontal segment of nano film 28 located under dielectric layer 34 remains intact due to the fact that it is not exposed during the etching process.

In one embodiment, for a magnetic reader or writer for example, nano trenches 40 and 42 have a general uniform width W1 in a range of about 5 nanometers to about 25 nanometers, depending on the thickness of nano film 28 deposited. Also, nano trenches 40 and 42 have a length L1 in a range of about 5 nanometers to about 500 nanometers and have a height H1 of about 5 nanometers to about 500 nanometers. These figures may vary in other embodiments.

FIG. 8 is a perspective view of the structure shown in FIG. 7 with nano trenches 40 and 42 filled with an electroplating material, forming nano wires 44 and 46. FIG. 8 illustrates Step 8 in the method.

Nano wires 44 and 46 are formed by electroplating nano trenches 40 and 42 with an electroplating material using a pulse plating technique commonly used in the art. In one embodiment, the electroplating material is copper. In other embodiments other electroplating metals, such as materials used as hard masks during ion milling, may be used. In one embodiment, dielectric layers 24 and 34 is are removed by etching. This in turn, leaves parallel nanowires 44 and 46 on initial layer 22.

Figure 9:
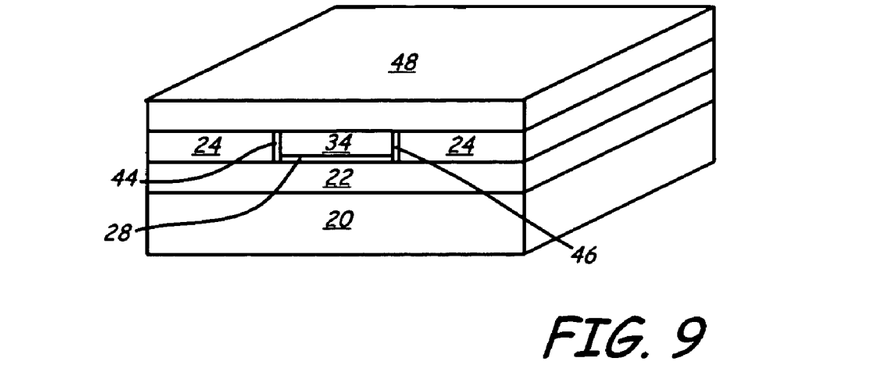
FIG. 9 is a perspective view of the structure shown in FIG. 8 with a dielectric layer formed.

FIG. 9 is a perspective view of the structure shown in FIG. 8 with a dielectric layer 48 formed. FIG. 9 illustrates Step 9 in the method. Dielectric layer 48 is formed using the same technique and according to the same principles as in Step 2, which is illustrated in FIG. 2. Dielectric layer 48 may be the same material as dielectric layer 24 and 34, silicon dioxide, or a different material.

For magnetic reader and writer application, dielectric layer 48 will have an identical thickness as dielectric layer 24. In other embodiments, the thickness of dielectric layer 48 may be greater or smaller than dielectric layer 24.

Figure 10:
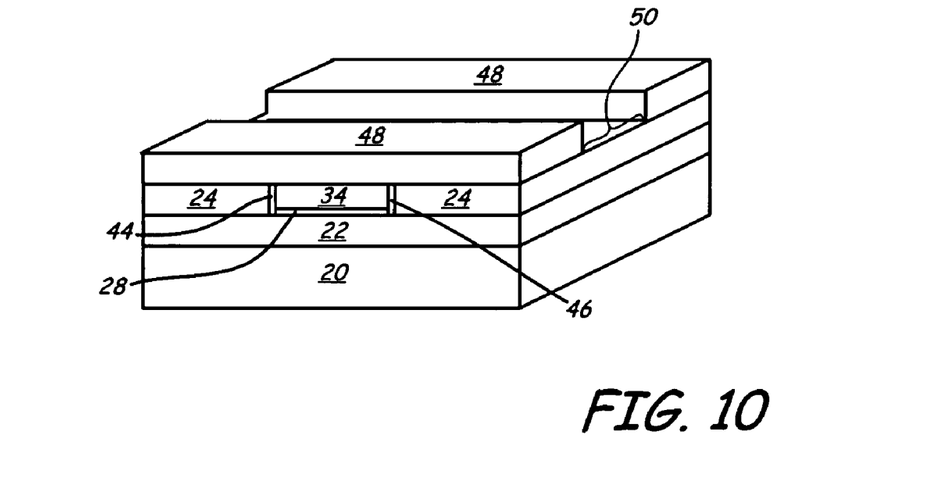
FIG. 10 is a perspective view of the structure shown in FIG. 9 with a middle segment removed.

FIG. 10 is a perspective view of the structure shown in FIG. 9 with a middle segment 50 removed. FIG. 10 illustrates Step 10 in the method. Middle segment 50 is removed using the same techniques and according to the same principles as in Step 3. Middle segment 50, however, is perpendicular to middle segment 26. This enables nano wire 44 and 46 to intersect with the eventual nano structures that will be formed within middle segment 50.

Figure 11:
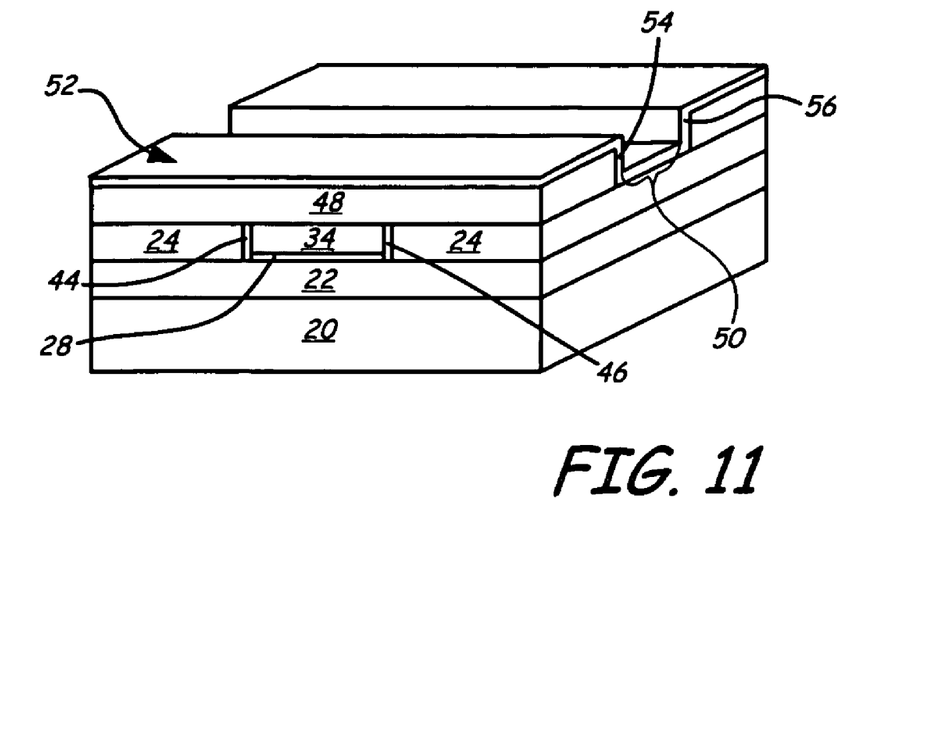
FIG. 11 is a perspective view of the structure shown in FIG. 10 with a nano film deposited.
Figure 12:
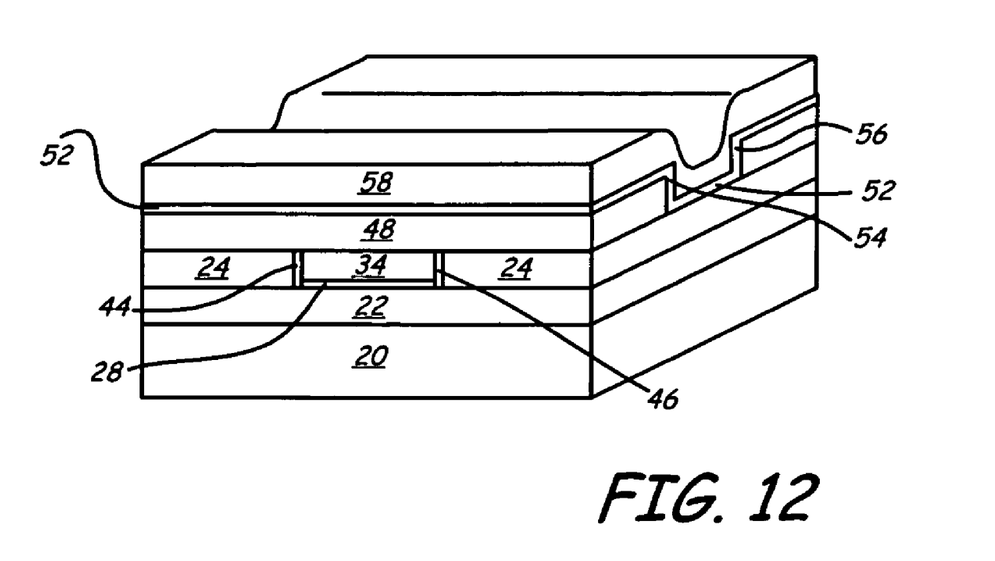
FIG. 12 is a perspective view of the structure shown in FIG. 11 with a dielectric layer formed.

FIG. 11 is a perspective view of the structure shown in FIG. 12 with a nano film 52 deposited. FIG. 11 illustrates Step 11 in the method. Nano film 52 is deposited using the same techniques and according to the same principles as nano film 28 in Step 4 (FIG.4).

Lanes 54 and lane 56 are filled with nano film 52 and are formed at a ninety degree angle where dielectric layer 48 meets dielectric layer 24. In one embodiment, nano film 52 is aluminum oxide ($Al_2O_3$) and is deposited in a thickness of about 25 nanometers down to about 5 nanometers. In other embodiments, nano film 52 can be any material that can be deposited in a thickness of 25 nanometers and below, and is different than dielectric layer 48. As articulated in Step 4, the thickness of deposited nano film 52 is directly proportional to the width of the eventual nano structures.

FIG. 12 is a perspective view of the structure shown in FIG. 11 with a dielectric layer 58 formed on top of nano film 52. FIG. 12 illustrates Step 12 of the method. Step 12 uses the same techniques and principles as Step 5 (FIG. 5).

Figure 13:
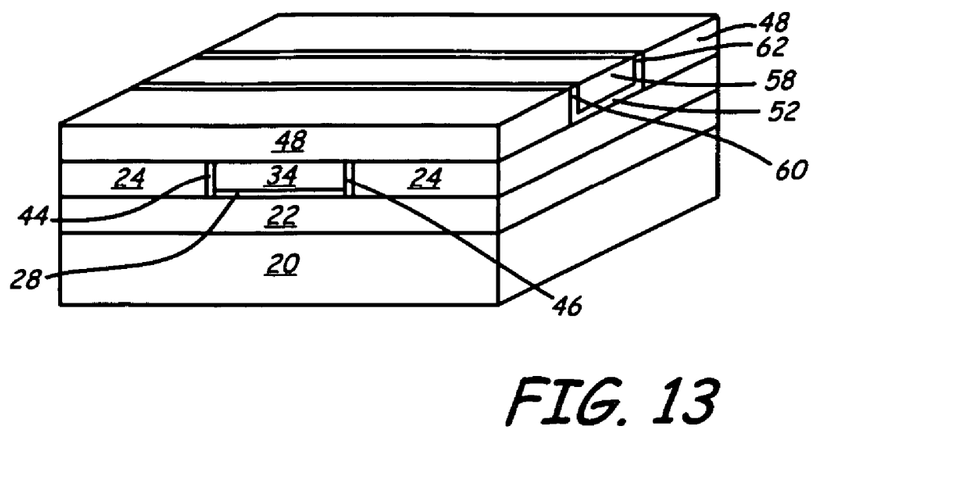
FIG. 13 is a perspective view of the structure shown in FIG. 12 with the excess dielectric layer removed and parallel nano structures formed.

FIG. 13 is a sectional view of the structure shown in FIG. 12 with the excess dielectric layer 58 and nano film 52 removed to form parallel nano structures 60 and 62. FIG. 13 illustrates Step 13 of the method. Step 13 uses the same techniques and principles as Step 6 (FIG. 6).

To create nano structures 60 and 62, nano film 52 "filling" lines 54 and 56 is removed. This is done through either a selective wet etching or selective dry etching process, or a combination of both wet and dry etching. Standard process wet or dry etching is known by someone skilled in the art. In one embodiment, nano film 52 is aluminum oxide and is removed through a selective dry etching process which uses a chlorine based gas, for example $BCl_3$, to selectively remove only aluminum oxide. In other embodiments, various other elements, for example fluorine, may be used or selective wet etching procedures utilizing sodium hydroxide or other solutions may be used to remove only nano film 52.

Figure 14:
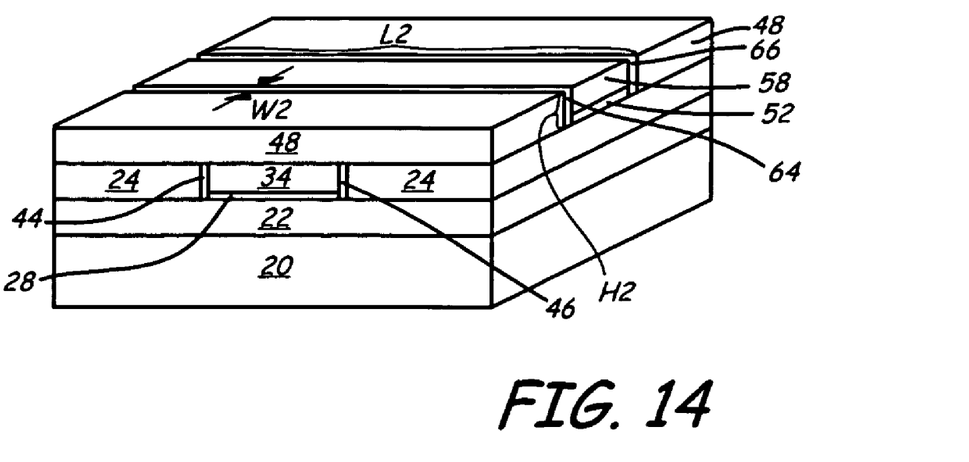
FIG. 14 is a perspective view of the structure shown in FIG. 13 with the nano film removed from the parallel nano structures, forming parallel nano trenches.

FIG. 14 is a perspective view of the structure shown in FIG. 13 with nano film 52 removed from nano structures 60 and 62 forming parallel nano trenches 64 and 66. FIG. 14 illustrates Step 14 of the method. Step 14 uses the same techniques and follows the same principles as Step 7 (FIG. 7).

Nano trenches 64 and 66 have a uniform width in a range of about 5 nanometers to about 25 nanometers, depending on the thickness of nano film 52 that was deposited. After etching nano film 52 from nano structures 60 and 62, fabrication of a nano wire can occur by electroplating nano trenches 64 and 66 with a conducting element such as copper. In other embodiments, nano trenches 64 and 66 are filled with other types of electroplating metals, or are left as nano trenches. If nano trenches 64 and 66 are filled with an electroplating material to become nanowires, then cross points are formed where perpendicular sets of nanowires intersect. These cross points can be used to actively control the material located in between. This can be used to increase the random access memory capacity.

In the magnetic recording head application, nano trenches 64 and 66 will have a length L2 in a range of about 5 nanometers to about 500 nanometers, a width W2 of about 5 nanometers to about 25 nanometers, and a height H2 of about 5 nanometers to about 500 nanometers.

Multiple layers of perpendicular nano structures can be formed by repeating Step 8 through Step 14.

The inventive method is described above in terms of creating a nano structure in a general device. The inventive method is further described in terms of forming a nano trench or a nano wire within a magnetic transducer.

The inventive method, however, has various potential applications. Currently, a method to reliably and uniformly create a nano trench or nano wire smaller than 25 nanometers is needed in the art. The method of the present invention substantially eliminates the difficulties associated with the production of uniform and consistent nano trenches or nano wires below 25 nanometers. The method comprises using atomic layer deposition, planarization, and etching techniques to form uniform nano structures in a wide variety of materials.

Although the present invention has been described with reference to preferred embodiments, workers skilled in the art will recognize that changes may be made in form and detail without departing from the spirit and scope of the invention.

The invention claimed is:

1. A method of making a nano structure smaller than 25 nanometers, the method comprising:
    depositing a nano film onto horizontal and vertical surfaces of a substrate using an atomic layer deposition process;
    forming a dielectric layer on top of the nano film; and
    planarizing the dielectric layer and the nano film so that the nano film is positioned between surfaces of the substrate and the dielectric layer and has a top surface with a width of about 25 nanometers or less; and
    forming a nano trench by etching the nano film positioned between vertical surfaces of the substrate and the dielectric layer.

2. The method of claim 1, and further comprising:
    filling the nano trench with an electroplating material to form a nano wire.

3. The method of claim 1, wherein etching the nano film is done utilizing a wet etching process.

4. The method of claim 1, wherein etching the nano film is done utilizing a dry etching process.

5. The method of claim 1, wherein etching the nano film is done utilizing a wet and dry etching combination.

6. The method of claim 1, wherein the nano structure has a height in a range of about 5 nanometers to about 500 nanometers.

7. The method of claim 1, wherein the nano structure has a generally uniform width in a range of about 5 nanometers to about 25 nanometers.

8. The method of claim 1, wherein the nano structure has a length in a range of about 5 nanometers to about 500 nanometers.

9. The method of claim 1, wherein the atomic layer deposition process further comprises:
    depositing the nano film in a generally uniform thickness range of about 5 nanometers to about 25 nanometers over horizontal and vertical surfaces of the substrate and the dielectric layer.

10. The method of claim 1, wherein planarizing the dielectric layer and nano film is done through a chemical mechanical polishing (CMP) technique that utilizes an abrasive slurry.

11. A device having a nano structure made by the method of claim 1.

12. The method of claim 2, and further comprising:
    removing the dielectric layer by etching after the nano wire is formed.

13. A method of making a nano structure smaller than 25 nanometers, the method compnsing:
    forming a substrate;
    depositing a first dielectric layer onto the substrate;
    removing a portion of the first dielectric layer thereby exposing a portion of the substrate;
    depositing a nano film onto a horizontal surface of the substrate and horizontal and vertical surfaces of the first dielectric layer;
    forming a second dielectric layer on top of the nano film;
    planarizing the second dielectric layer and the nano film; and
    forming a nano trench by etching the nano film located between surfaces of the first dielectric layer and the second dielectric layer.

14. The method of claim 13, wherein etching the nano film is done utilizing a wet etching process.

15. The method of claim 13, wherein etching the nano film is done utilizing a dry etching process.

16. The method of claim 13, wherein etching the nano film is done utilizing a wet and dry etching combination.

17. The method of claim 13, further comprising:
    forming a nano wire by electroplating the nano trench with a conducting material.

18. The method of claim 13, wherein the nano structure has a height in a range of about 5 nanometers to about 500 nanometers.

19. The method of claim 13, wherein the nano structure has a generally uniform width in a range of about 5 nanometers to about 25 nanometers.

20. The method of claim 13, wherein the nano structure has a length in a range of about 25 nanometers to about 100 nanometers.

21. The method of claim 13, wherein planarizing the second dielectric layer and the nano film is done through a chemical mechanical polishing (CMP) technique that utilizes an abrasive slurry.

22. A device having a nano structure made by the method of claim 13.

23. The method of claim 17, and further comprising:
    removing the first dielectric layer and the second dielectric layer, leaving the nano wire and the substrate.

24. The method of claim 23, and further comprising:
    removing the first dielectric layer and the second dielectric layer by etching.

25. A method of making generally uniform nano structures smaller than 25 nanometers on multiple layers, the method comprising:
    forming a substrate;
    forming a first dielectric layer onto the substrate;
    removing a portion of the first dielectric layer thereby exposing a portion of the substrate;
    depositing a first nano film onto horizontal surfaces of the substrate and horizontal and vertical surfaces of the first dielectric layer;
    forming a second dielectric layer on top of the first nano film;
    planarizing the second dielectric layer and the first nano film;
    forming a first set of nano trenches by etching the first nano film located between surfaces of the first dielectric layer and the second dielectric layer;
    forming a first set of nano wires by electroplating the first set of nano trenches;
    forming a third dielectric layer;
    removing a portion of the third dielectric layer;
    depositing a second nano film onto horizontal and vertical surfaces of the third dielectric layer including the area where the portion was removed;
    forming a fourth dielectric layer on top of the second nano film;
    planarizing the fourth dielectric layer and the second nano film; and
    forming a second set of nano trenches by etching the second nano film located between surfaces of the third dielectric layer and the fourth dielectric layer.

26. The method of claim 25, wherein the multiple layers continue by electroplating the second set of nano trenches to form a second set of nano wires.

27. The method of claim 25, wherein etching the first and the second nano film is done utilizing a wet etching process.

28. The method of claim 25, wherein etching the first and the second nano film is done utilizing a dry etching process.

29. The method of claim 25, wherein etching the first and the second nano film is done utilizing a wet and dry etching combination.

30. The method of claim 25, wherein the nano structures have a height in a range of about 5 nanometers to about 500 nanometers.

31. The method of claim 25, wherein the nano structures have a uniform width in a range of about 5 nanometers to about 25 nanometers.

32. The method of claim 25, wherein the nano structures have a length in a range of about 5 nanometers to about 500 nanometers.

33. The method of claim 25, wherein planarizing the second dielectric layer and the first nano film, and the fourth dielectric layer and the second nano film is done through a chemical mechanical polishing (CMP) technique that utilizes an abrasive slurry.

34. A device having nano structures made by the method of claim 25.

35. The method of claim 26 wherein cross points between sets of nano wires actively control intervening layers.

* * * * *

UNITED STATES PATENT AND TRADEMARK OFFICE
CERTIFICATE OF CORRECTION

PATENT NO. : 7,323,387 B2  Page 1 of 1
APPLICATION NO. : 10/987743
DATED : January 29, 2008
INVENTOR(S) : Ge Yi It is certified that error appears in the above-identified patent and that said Letters Patent is hereby corrected as shown below:

Title Page, Item (75) Inventors, delete "Culmore (IE.)",
insert --Culmore (UK)--

Column 4, Line 58, delete "FIG. Illustrates Step 6",
Insert --FIG. 6 illustrates Step 6--

Column 5, Line 41, delete "layers 24 and 34 is are removed by"
insert --layers 24 and 34 and removed by--

Column 7, Line 59, delete "method compnsing:",
insert --method comprising--

Signed and Sealed this

Twenty-second Day of July, 2008

JON W. DUDAS
*Director of the United States Patent and Trademark Office*